Sept. 18, 1951 W. O. KENYON ET AL 2,568,503
CELLULOSE ESTER LITHOGRAPHIC PRINTING PROCESS
Filed Feb. 9, 1949
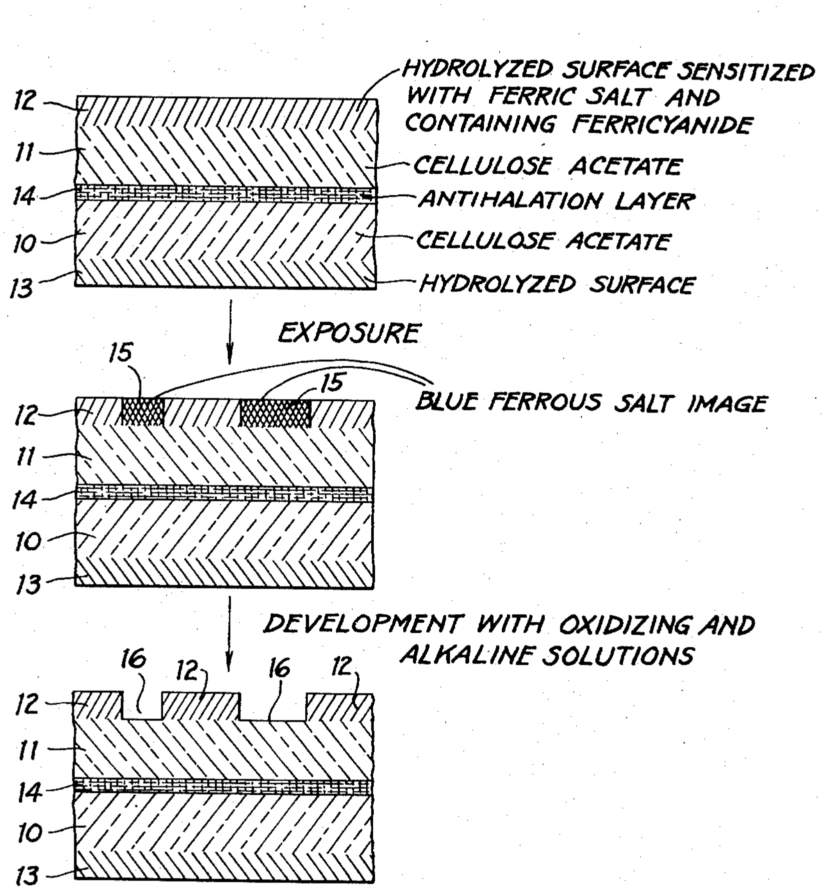
WILLIAM O. KENYON
JOHN A. CATHCART
INVENTORS
BY Daniel I. Mayne
W. H. McDowell
ATTORNEY & AGENT Patented Sept. 18, 1951 2,568,503

UNITED STATES PATENT OFFICE 2,568,503

CELLULOSE ESTER LITHOGRAPHIC PRINTING PROCESS

William O. Kenyon and John A. Cathcart, Rochester, N. Y., assignors to Eastman Kodak Company, Rochester, N. Y., a corporation of New Jersey Application February 9, 1949, Serial No. 75,452

8 Claims. (Cl. 95—5.4)

This invention relates to the preparation of lithographic printing plates.

Printing plates of the lithographic type are well known, having previously been prepared, for example, from metal plates carrying sensitive colloid layers and from cellulose ester plates carrying a sensitive stratum or layer. The Colt U. S. Patent 2,448,861, granted September 7, 1948, describes a method for the preparation of cellulose ester printing plates according to which a hydrolyzed surface layer of a cellulose ester sheet is sensitized with bichromate and after exposure under a design the exposed area is removed with solutions of chlorites or hypochlorites, thereby providing ink-receptive areas in the region of the exposure, the remaining areas of the element being ink-repellent.

In all processes of preparing printing plates, it is desirable to inspect the quality of the printing plate as quickly as possible after the exposure has been made rather than waiting for a proof to be drawn from the printing press. The skilled operator can generally predict from visual examination of the line or half-tone dot image what quality of print can be obtained from the plate. When using cellulose ester plates it is equally desirable to quickly inspect the work but since the hydrolyzed and unhydrolyzed areas of such plates have approximately the same color and transparency, some means must be provided to enable quick visual differentiation of exposed and unexposed areas. One way of doing this, consists in dyeing the ink-repellent non-hydrolyzed areas of such plates with a dye specific for the cellulose ester, just after etching away the exposed hydrolyzed area.

We have discovered a process of preparing cellulose ester printing plates which automatically produces well delineated images of the printing area for visual inspection. Another feature and advantage of our process lies in the fact that the agents employed for producing the visually delineated images are also the agents which impart light sensitivity to the original hydrolyzed cellulose ester surface.

Therefore, one object of our invention is to provide a novel process for preparing cellulose ester printing plates. Another object is to provide a means of visual inspection of the quality of a printing plate enabling prediction of the ultimate quality of the print. Another object is to provide novel sensitizing agents for cellulose ester printing plates which may also be used to produce the well delineated images for visual inspection.

The objects of our invention are accomplished in part by using for the sensitizing agent for a cellulose ester printing plate, ferric salts which are reducible during exposure to blue or ultraviolet light in the presence of organic matter, but which are per se not capable of oxidizing hydrolyzed cellulose ester to an alkali-susceptible condition in the presence of light. That is, in the process of the copending Kenyon et al. U. S. patent application, Serial No. 75,453, filed concurrently herewith, now Patent No. 2,548,537, strong oxidizing agents for cellulose such as bichromate and ferric chloride are used for sensitizing the colloid layer and during exposure the sensitizer oxidizes the hydrolyzed cellulose ester surface in the exposed area to an alkali-susceptible state so that in a subsequent step the exposed area of the layer may be removed with alkaline solution to bare the ink-receptive cellulose ester layer underneath. In the present invention, we utilize ferric salt sensitizers which are extremely weak oxidizing agents for cellulose but which are reducible with light to ferrous salt images, which images may be used for catalyzing the oxidation of the hydrolyzed cellulose ester to the alkali-susceptible state only in the region of the ferrous salt image.

The sensitizing agents we use for carrying out our process are iron salts having the mentioned property of not appreciably oxidizing cellulose but which are readily reducible in the presence of light to ferrous salts, such as ferric ammonium salts of weak organic acids, for example, ferric ammonium citrate, oxalate, tartrate, etc.

Our invention will be better understood by consideration of the following illustrative examples, and the drawings which show in enlarged cross-sectional view the appearance of a representative printing plate at various stages in our process.

Here and in the appended claims, we refer to the exposed areas of the printing plate as being "removable" rather than "dissolved" by the alkaline oxidizing solution because it appears from the theory of the mechanism of the process that the ferrous salt in the exposed area of the sensitized hydrolyzed surface catalyzes oxidation of the cellulose by the alkaline oxidizing solution to produce a weak link in the cellulose chain at which point alkaline degradation is initiated and propagated along the chain with the final result that the exposed areas are removable.

*Example 1*

A sheet of surface-hydrolyzed cellulose triacetate was impregnated with a solution of 18.3 grams of ferric ammonium citrate and 13.7 grams of potassium ferricyanide in 200 cc. of water to which a wetting agent had been added. After drying the element, it was exposed under a negative for 1–1½ minutes at 18 inches from a 35-ampere carbon arc or five minutes at 12 inches from a 275-watt mercury vapor lamp. The sheet was washed in water and a blue image appeared in the exposed area resulting from the reaction of the reduced iron salt with the ferricyanide. At this point it was possible to inspect the plate and determine whether exposure had been satisfactory. Thereafter the sheet was treated with a three per cent solution of hydrogen peroxide in N/100 sodium hydroxide for three minutes and the blue image gradually disappeared as the oxidized cellulose was removed. The disappearance of the blue image provides a criterion by which the progress of etching can be judged visually. The plate was subsequently printed in a lithographic press and yielded prints of high definition. In this process, if desired, the ferricyanide may be utilized as a separate bath after exposure of the ferric salt sensitized layer whereupon the blue image develops.

*Example 2*

A surface-hydrolyzed cellulose triacetate sheet was impregnated with an aqueous solution containing 10 per cent ferric ammonium citrate and 2 per cent ferric ammonium oxalate. Following drying of the sheet, it was exposed as above to produce a ferrous salt image in the exposed area, and thereafter the sheet was immersed in a one per cent solution of silver nitrate with the result that silver was deposited in the exposed area and rendered the exposed area readily visible. The hydrolyzed cellulose ester in that area was then oxidized and rendered alkali-removable by treatment of the sheet with a 10 per cent ammonium persulfate solution for five minutes and the exposed area was then removed by treatment of the sheet with dilute sodium hydroxide solution. When the plate was moistened with water the areas of the cellulose ester support thus bared with the alkali solution were found to be ink-receptive and other areas consisting of hydrolyzed cellulose ester were ink-repellent. Prints of excellent quality were obtained by use of the plate in a lithographic press. In the above process, if desired, the soluble silver salt such as silver nitrate may be incorporated into the sensitive layer before exposure whereby the silver image is formed during exposure. This procedure provides a quick means of determining whether the exposure has been satisfactory.

*Example 3*

A laminated film such as described in the Nadeau et al. U. S. patent application, Serial No. 75,444, filed concurrently herewith, having an antihalation layer sealed within the support, was surface-hydrolyzed in the usual manner and sensitized with ferric salt and ferricyanide as in Example 1. The element appears as shown in the first stage of the drawings wherein cellulose acetate layer 10, having the hydrolyzed surface stratum 13, and the cellulose acetate layer 11 carrying the sensitive hydrolyzed surface stratum 12, are shown disposed on each side of the yellow antihalation layer 14. The sensitive film was then exposed under a line or halftone negative using the mentioned exposure conditions, then washed to remove soluble salts and to produce the blue image as shown in the second stage of the drawings wherein the sensitive layer 12 now contains the blue images 15 in the exposed area of the layer. However, as previously explained, these areas are not yet removable with simple alkaline solutions because they have not been oxidized to the alkali-removable state. When oxidizing solutions such as alkaline peroxide solution or a peroxide solution followed by an alkaline solution were applied to the layer, the cellulose became oxidized in the exposed area and alkali removed it, leaving those areas 16 of layer 12 bare and thus ink-receptive, and areas 12 of hydrolyzed cellulose ester remained ink-repellent when the element was moistened, as shown in the last stage of the drawings.

It will be apparent to those familiar with iron salt sensitizing and dichromate sensitizing wherein another advantage of our process lies. That is, when we use iron salt sensitizing instead of bichromate sensitizing, we can presensitize the hydrolyzed cellulose ester surface in advance of use whereas, as is well known, colloid materials sensitized with bichromate deteriorate fairly rapidly. In a matter of a few days, bichromated surface hydrolyzed cellulose ester sheets become useless because the bichromate even in the absence of light, produces a slow but continuous oxidation of the cellulose layer to an alkali-susceptible condition.

A variation of our process consists in the use of a sensitive element such as shown in the first stage of the drawings but having a reinforced base which provides dimensional stability. This may be effected by lamination of the sensitive film to a metal surface such as aluminum foil by means of a suitable adhesive before or after surface hydrolysis of the sheet. The element is exposed and processed as described in the above examples. Alternately, we take a single sheet of cellulose ester, preferably cellulose triacetate, and before or after hydrolysis laminate it to the metal surface. However, in this case we either provide the sheet with an antihalation layer, preferably subsequent to hydrolysis, or apply the antihalation layer to the metal surface before lamination of the sheet thereto. We can, of course, apply the antihalation layer and the cellulose ester layer to the auxiliary support by the usual coating methods from solvent compositions in which case hydrolysis of the surface is effected after coating. Other methods of reinforcing the cellulose ester sheet will occur to those skilled in the art such as lamination to non-distensible layers like waterproof paper.

The cellulose ester we use in making the printing plate is a plasticized cellulose organic ester preferably substantially fully esterified cellulose ester like cellulose acetate having the maximum resistance to moisture and containing about 43.5 per cent acetyl although useful results can be obtained with cellulose propionate, acetate-propionate, of equivalent acyl content and moisture resistance. Surface hydrolysis can be carried out by the usual method such as by passing the sheet through aqueous alcoholic caustic alkali for the time and under the conditions required to hydrolyze the sheet to the required extent, then washing and neutralizing excess alkali with acid solution such as acetic acid.

Our invention having been described we would have it understood that the disclosure herein is by way of example and that we consider as included in our invention all modifications and equivalents falling within the scope of the appended claims.

We claim:

1. The method of forming a design on a cellulosic surface for printing purposes, which comprises sensitizing a hydrolyzed surface layer of a cellulose organic acid ester sheet with a ferric salt reducible with light of the blue and ultra-violet regions of the spectrum but incapable of oxidation of hydrolyzed cellulose organic acid ester to the alkali removable state in the presence of said light, exposing said sensitive layer under a design thereby producing a ferrous salt image in the exposed areas, treating the exposed layer with an oxidizing agent oxidizing said hydrolyzed cellulose ester layer only in the region of said ferrous salt image and removing the oxidized material with an alkaline solution.

2. The method of forming a design on a cellulosic surface for printing purposes, which comprises sensitizing a hydrolyzed surface layer of a cellulose organic acid ester sheet with a ferric ammonium salt of an organic acid, exposing said sensitive layer under a design thereby producing a ferrous salt image in the exposed areas, treating the exposed layer with an oxidizing agent oxidizing said hydrolyzed cellulose ester layer only in the region of said ferrous salt image and removing the oxidized material with an alkaline solution.

3. The method of forming a design on a cellulosic surface for printing purposes, which comprises sensitizing a hydrolyzed surface layer of a cellulose organic acid ester sheet with a ferric ammonium salt of an organic acid, exposing said sensitive layer under a design thereby producing a ferrous salt image in the exposed areas, converting said ferrous salt image to a ferrous ferricyanide image, treating the exposed layer with an oxidizing agent oxidizing said hydrolyzed cellulose ester layer only in the region of said ferrous salt image and removing the oxidized material with an alkaline solution.

4. The method of forming a design on a cellulosic surface for printing purposes, which comprises sensitizing a hydrolyzed surface layer of a cellulose organic acid ester sheet with ferric ammonium oxalate, exposing said sensitive layer under a design thereby producing a ferrous salt image in the exposed areas, converting said ferrous salt image to a ferrous ferricyanide image, treating the exposed layer with an oxidizing agent oxidizing said hydrolyzed cellulose ester layer only in the region of said ferrous salt image and removing the oxidized material with an alkaline solution.

5. The method of forming a design on a cellulosic surface for printing purposes, which comprises sensitizing a hydrolyzed surface layer of a cellulose organic acid ester sheet with ferric ammonium citrate, exposing said sensitive layer under a design thereby producing a ferrous salt image in the exposed areas, converting said ferrous salt image to a ferrous ferricyanide image, treating the exposed layer with an oxidizing agent oxidizing said hydrolyzed cellulose ester layer only in the region of said ferrous salt image and removing the oxidized material with an alkaline solution.

6. The method of forming a design on a cellulosic surface for printing purposes, which comprises sensitizing a hydrolyzed surface layer of a cellulose organic acid ester sheet with a ferric ammonium salt of an organic acid, exposing said sensitive layer under a design thereby producing a ferrous salt image in the exposed areas, forming a silver image in the region of said ferrous salt image, treating the exposed layer with an oxidizing agent oxidizing said hydrolyzed cellulose ester layer only in the region of said silver image and removing the oxidized material with an alkaline solution.

7. The method of forming a design on a cellulosic surface for printing purposes, which comprises sensitizing a hydrolyzed surface layer of a cellulose organic acid ester sheet with a ferric ammonium salt of an organic acid and a soluble silver salt, exposing said sensitive layer under a design thereby producing a silver image in the region of said exposure, treating the exposed layer with an oxidizing agent oxidizing said hydrolyzed cellulose ester layer only in the region of said silver image and removing the oxidized material with an alkaline solution.

8. The method of forming a design on a cellulosic surface for printing purposes, which comprises sensitizing a hydrolyzed surface layer of a cellulose organic acid ester sheet with a ferric ammonium salt of an organic acid and ferricyanide, exposing said sensitive layer under a design thereby producing a ferrous salt image in the exposed areas, treating the exposed layer with an oxidizing agent oxidizing said hydrolyzed cellulose ester layer only in the region of said ferrous salt image and removing the oxidized material with an alkaline solution.

WILLIAM O. KENYON.
JOHN A. CATHCART.

REFERENCES CITED

The following references are of record in the file of this patent:

FOREIGN PATENTS

| Number | Country | Date |
|---|---|---|
| 337,868 | Great Britain | Nov. 13, 1930 |